(12) United States Patent
Rice

(10) Patent No.: US 9,500,413 B1
(45) Date of Patent: Nov. 22, 2016

(54) THERMOSIPHON SYSTEMS WITH NESTED TUBES

(75) Inventor: Jeremy Rice, San Jose, CA (US)

(73) Assignee: Google Inc., Mountain View, CA (US)

(*) Notice: Subject to any disclaimer, the term of this patent is extended or adjusted under 35 U.S.C. 154(b) by 808 days.

(21) Appl. No.: 13/523,781

(22) Filed: Jun. 14, 2012

(51) Int. Cl.
*F28F 27/00* (2006.01)
*F28D 15/02* (2006.01)
*F28D 15/04* (2006.01)

(52) U.S. Cl.
CPC ........... *F28D 15/0266* (2013.01); *F28D 15/04* (2013.01)

(58) Field of Classification Search
CPC .. F28D 15/02; F28D 15/0233; F28D 15/025; F28D 15/0266; F28D 15/0275; F28D 15/04; F28D 15/043; H01L 23/3675
USPC ................. 165/274, 104.19, 104.21, 104.22, 165/104.26, 104.33
See application file for complete search history.

(56) References Cited

U.S. PATENT DOCUMENTS

| | | | |
|---|---|---|---|
| 3,777,502 A * | 12/1973 | Michie et al. ................. | 62/50.7 |
| 4,027,728 A | 6/1977 | Kobayashi et al. | |
| 4,463,798 A * | 8/1984 | Pogson ............... | F28D 15/0241 165/104.23 |
| 4,640,347 A * | 2/1987 | Grover et al. ........... | 165/104.26 |
| 5,076,351 A | 12/1991 | Munekawa et al. | |
| 5,216,580 A | 6/1993 | Davidson et al. | |
| 5,390,077 A | 2/1995 | Paterson | |
| 5,634,270 A | 6/1997 | Lu | |
| 5,694,295 A | 12/1997 | Mochizuki et al. | |
| 5,737,923 A | 4/1998 | Gilley et al. | |
| 5,966,957 A | 10/1999 | Malhammar et al. | |
| 6,073,683 A | 6/2000 | Osakabe et al. | |
| 6,105,662 A * | 8/2000 | Suzuki ..................... | 165/104.33 |
| 6,561,262 B1 | 5/2003 | Osakabe et al. | |
| 6,633,484 B1 | 10/2003 | Lee et al. | |
| 6,725,908 B2 | 4/2004 | Suzuki | |
| 6,840,311 B2 | 1/2005 | Ghosh et al. | |
| 6,854,512 B2 | 2/2005 | Lee et al. | |
| 6,874,567 B2 | 4/2005 | Ohara | |
| 6,917,522 B1 | 7/2005 | Erturk et al. | |
| 7,012,807 B2 | 3/2006 | Chu et al. | |
| 7,055,341 B2 | 6/2006 | Nori et al. | |
| 7,154,749 B2 | 12/2006 | Stefanoski et al. | |
| 7,246,655 B2 | 7/2007 | Mochizuki et al. | |
| 7,556,086 B2 | 7/2009 | Joshi et al. | |

(Continued)

FOREIGN PATENT DOCUMENTS

WO 2010/027311 11/2010

OTHER PUBLICATIONS

Bielinksi, Henryk et al., Computer Cooling Using a Two Phase Minichannel Thermosyphon Loop Heated from Horizontal and Vertical Sides and Cooled from Vertical Side, Archives of Thermodynamics, vol. 31 (2010), No. 4, pp. 51-59, Oct. 2010.

(Continued)

*Primary Examiner* — Travis Ruby
(74) *Attorney, Agent, or Firm* — Fish & Richardson P.C.

(57) ABSTRACT

A thermosiphon system includes a condenser, an evaporator including a housing and a wick located in the housing, and a condensate line fluidically coupling the condenser to the evaporator. The condensate line includes an outer tube and an inner tube nested within the outer tube. A first passage defined by the inner tube is positioned to carry a liquid phase of a working fluid from the condenser to the evaporator, and a second passage defined by a volume between the inner tube and the outer tube is positioned to carry a vapor phase of the working fluid from the evaporator to the condenser.

17 Claims, 7 Drawing Sheets

(56) References Cited

U.S. PATENT DOCUMENTS

| | | | |
|---|---|---|---|
| 8,130,497 B2 | 3/2012 | Kondo et al. | |
| 2002/0023456 A1 | 2/2002 | Sone | |
| 2002/0075652 A1* | 6/2002 | Berchowitz | 361/700 |
| 2005/0082158 A1* | 4/2005 | Wenger | 202/155 |
| 2005/0194122 A1* | 9/2005 | Wert | 165/104.21 |
| 2006/0144565 A1 | 7/2006 | Tsai et al. | |
| 2006/0196640 A1 | 9/2006 | Siu | |
| 2006/0283577 A1 | 12/2006 | Liu et al. | |
| 2007/0187072 A1* | 8/2007 | Chin et al. | 165/104.26 |
| 2007/0246193 A1 | 10/2007 | Bhatti et al. | |
| 2007/0284090 A1* | 12/2007 | Wu et al. | 165/104.26 |
| 2008/0110599 A1 | 5/2008 | Reyzin et al. | |
| 2008/0236789 A1 | 10/2008 | Bhatti et al. | |
| 2008/0247137 A1 | 10/2008 | Dautert et al. | |
| 2009/0242174 A1* | 10/2009 | McCutchen et al. | 165/104.25 |
| 2010/0073863 A1 | 3/2010 | Matsushima et al. | |
| 2011/0198057 A1* | 8/2011 | Lange et al. | 165/104.26 |
| 2011/0198060 A1* | 8/2011 | Lange et al. | 165/104.33 |
| 2011/0277967 A1 | 11/2011 | Fried et al. | |

OTHER PUBLICATIONS

Publication entitles "3D-CFD Simulation and Neural Network" Jul. 2010, authored by M. Khoshvaght Aliabadi, M. Gholam Samani, F. Hormozi and A. Haghighi Asl.

* cited by examiner

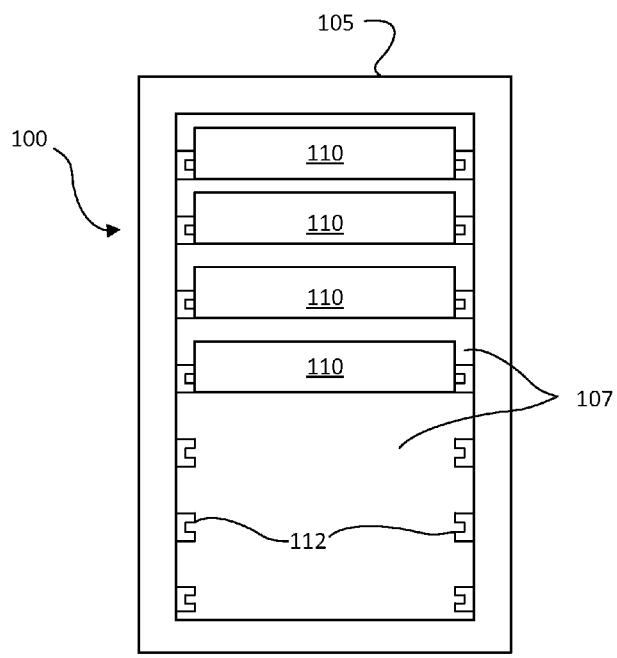
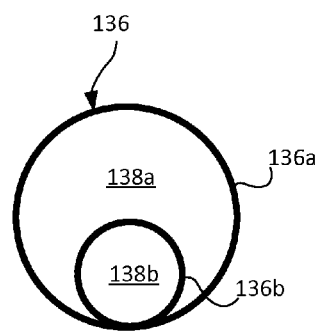
FIG. 1
FIG. 2B
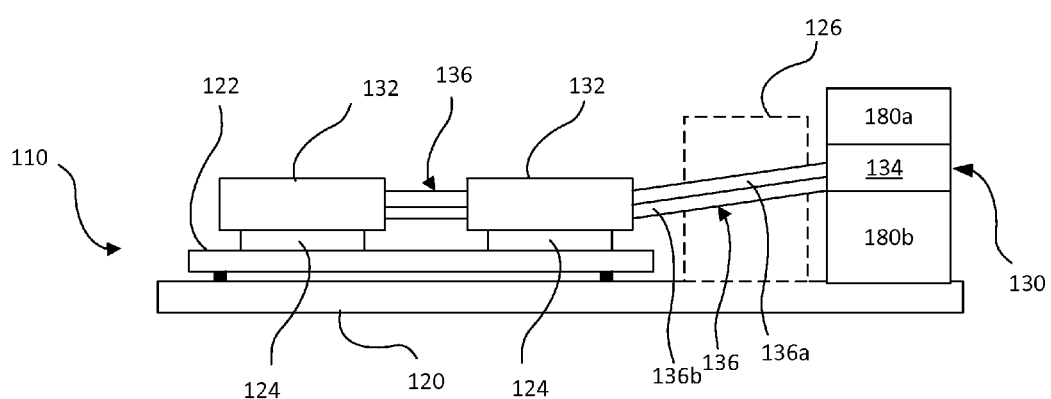
FIG. 2A

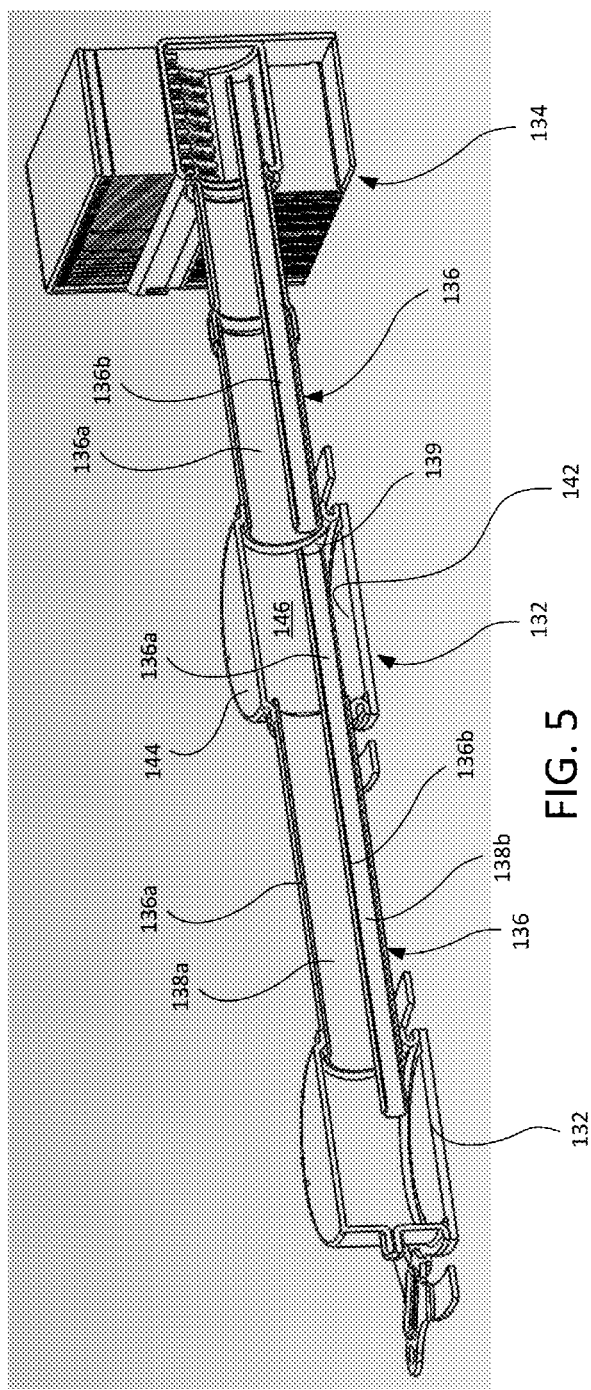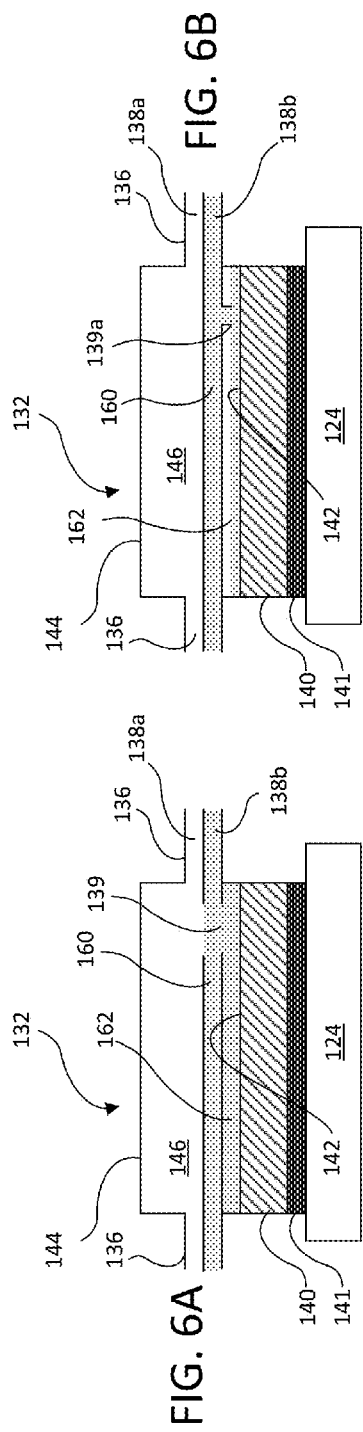

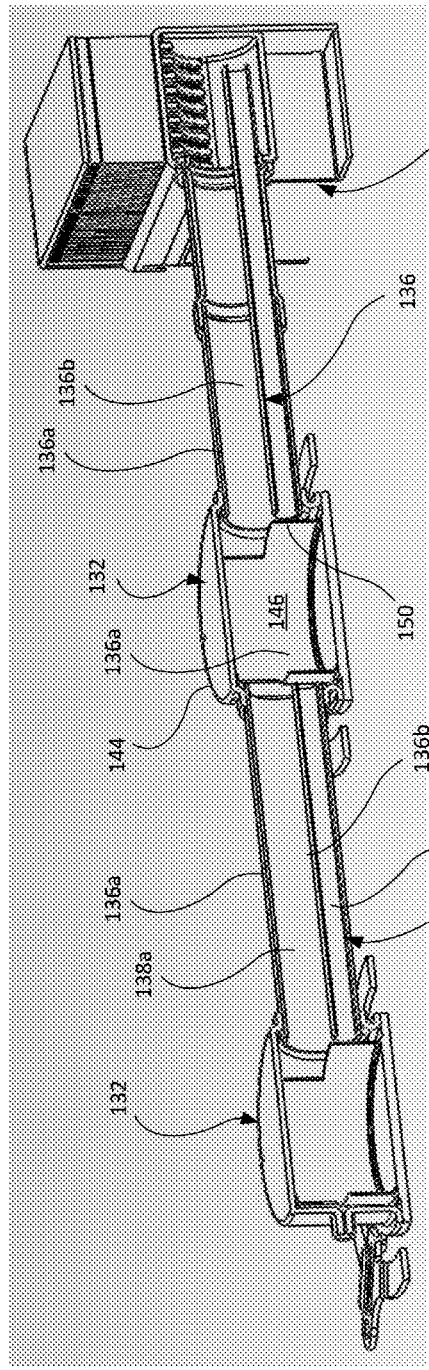
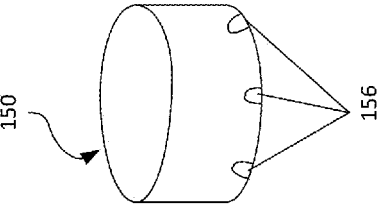
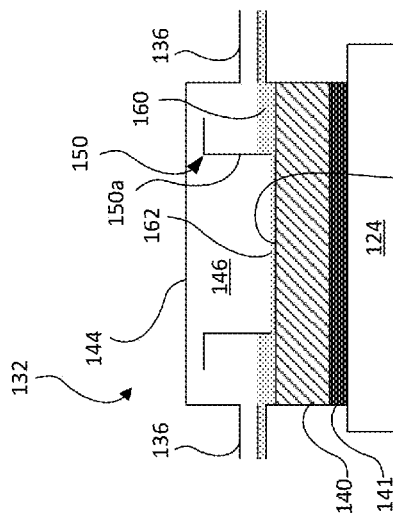
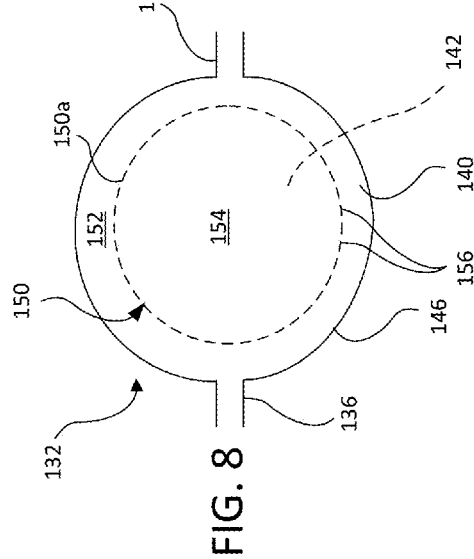

THERMOSIPHON SYSTEMS WITH NESTED TUBES

TECHNICAL FIELD

This invention relates to thermosiphon systems to remove heat from electronic devices.

BACKGROUND

Computer users often focus on the speed of computer microprocessors (e.g., megahertz and gigahertz). Many forget that this speed often comes with a cost-higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, and other heat generating devices) that are located on a server rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

Thermosiphons are heat exchangers that operate using a fluid that undergoes a phase change. A liquid form of the fluid is vaporized in an evaporator, and heat is carried by the vapor form of the fluid from the evaporator to a condenser. In the condenser, the vapor condenses, and the liquid form of the fluid is then returned via gravity to the evaporator. Thus, the fluid circulates between the evaporator and the condenser without need of a mechanical pump.

SUMMARY

As noted above, electronic devices, e.g., computer components, such as processors and memories, generate heat. A thermosiphon system can be used to remove heat from such an electronic device. Although some systems have been proposed for removing heat from computer components, the limited space available in the server rack environment introduces an additional challenge to thermosiphon system design. In addition, for commercial applicability, the thermosiphon needs to operate with high efficiency.

Several approaches are described, which can be used individually or in combination in order to improve efficiency. Nested tubes can be used to carry the liquid condensate from the condenser to the evaporator and to carry the vapor from the evaporator to the condenser. The evaporator can be constructed without a flow restrictor.

In one aspect, a thermosiphon system includes a condenser, an evaporator including a housing and a wick located in the housing, and a condensate line fluidically coupling the condenser to the evaporator. The condensate line includes an outer tube and an inner tube nested within the outer tube. A first passage defined by the inner tube is positioned to carry a liquid phase of a working fluid from the condenser to the evaporator, and a second passage defined by a volume between the inner tube and the outer tube is positioned to carry a vapor phase of the working fluid from the evaporator to the condenser.

Implementations may include one or more of the following features. The inner tube may have a cross-sectional area about 5-25% of the outer tube. The inner tube may contact a bottom inner surface of the outer tube. The inner tube may be bonded to the bottom inner surface of the outer tube. The evaporator may include a chamber within the housing and the inner tube may project into the chamber. The outer tube may be flush with the housing. The inner tube may include an aperture positioned over the wick. The aperture may be positioned at a center of the wick. The aperture may include a port projecting downwardly from the inner tube. The aperture may include a gap between two portions of the inner tube. The condenser may include a central channel and the inner tube may project into the central channel. The outer tube may be flush with an outer face of the central channel. The evaporator may include a flow restrictor located in the housing to restrict flow of the working fluid onto the wick.

In another one aspect, a thermosiphon system includes an evaporator, a condenser, and a condensate line fluidically coupling the condenser to the evaporator. The condenser includes a central channel and a plurality of parallel chambers extending laterally from the central channel and having closed off top ends. The chambers have distal ends farther from the central channel, and the condenser includes at least one fluid escape channel connecting the distal ends of the chambers to the central channel.

Implementations can include one or more of the following features. The condensate line may be fluidically coupled to a first side of the central channel, and the fluid escape channel may connect the distal ends of the chambers to a second side of the central chamber opposite the first side. The fluid escape channel may be shorter than the chambers. The condenser may include a body having a cavity formed therein and a plurality of walls in the cavity that divide the cavity into the plurality of parallel chambers. A first set of the plurality of vertically-extending chambers may extend laterally from a first side of the central channel, and a second set of the plurality of vertically-extending chambers may extend laterally from an opposite second side of the central channel. A plurality of heat conducting fins may project outwardly from the body. The plurality of heat conducting fins may project vertically from the body.

One or more of the following advantages may be realized. The thermosiphon system can fit within the limited horizontal and vertical space of the server rack. A thin layer of liquid can be maintained in the evaporator over the region where the evaporator contacts the electronic device, thus reducing thermal resistance of the evaporator to absorption of heat from the electronic device. Shear stress between the liquid and the vapor flowing in opposite directions can be reduced, thus improving condensate flow to the evaporator and improving efficiency. In addition, nested tubes can require fewer joints that are required to be leak-tight, thus improving lifetime of the device. The nested tubes can provide a superior form factor, e.g., similar functionality with less space occupied by extraneous tubing.

The details of one or more implementations are set forth in the accompanying drawings and the description below. Other aspects, features, and advantages of the invention will be apparent from the description and drawings, and from the claims.

DESCRIPTION OF DRAWINGS

FIG. 1 illustrates a side view of a server rack and a server-rack sub-assembly configured to mount within the rack.

FIGS. 2A and 3 illustrate a side view and a top view of a server rack sub-assembly.

FIG. 2B illustrates a cross-sectional view of a condensate/vapor line.

FIG. 5 illustrates a perspective view, partially cut away, of a thermosiphon system.

FIGS. 6A and 6B illustrate cross-sectional side views of implementations of an evaporator from a thermosiphon system.

FIG. 7 illustrates a perspective view, partially cut away, of an evaporator from the thermosiphon system.

FIG. 8 illustrates a top view of an evaporator from the thermosiphon system of FIG. 7.

FIG. 9 illustrates a cross-sectional side view of an evaporator from FIG. 7.

FIG. 10 illustrates a perspective view of a fluid barrier from an evaporator.

Like reference symbols in the various drawings indicate like elements.

DETAILED DESCRIPTION

Figure 3:
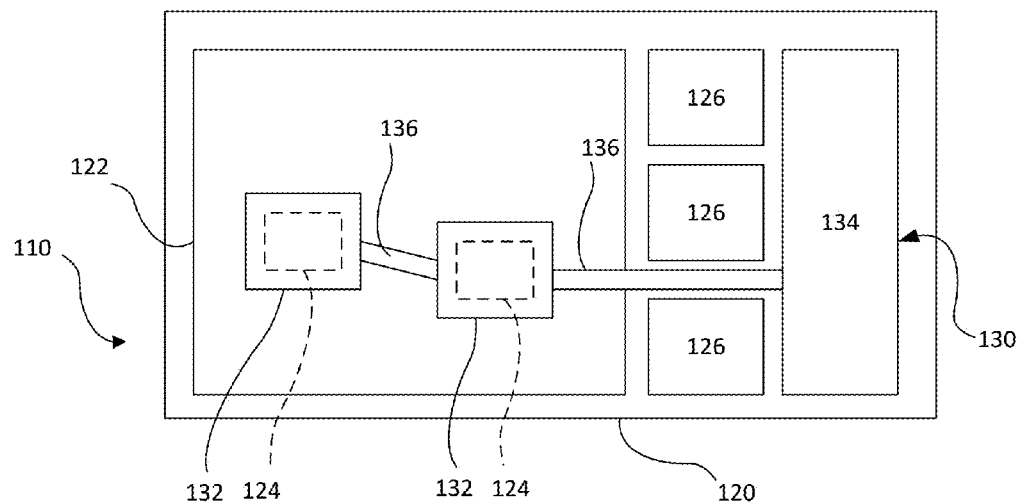

This document discusses a thermosiphon system that can be implemented to remove heat from an electronic device, e.g., a component of computing equipment, such as a processor or memory. The evaporator of the thermosiphon system contacts the electronic device so that the electronic device experiences a conductive heat transfer effect. Thus, the thermosiphon system can act as a heat sink for the electronic device, reducing the likelihood of overheating and subsequent failure of the electronic device.

In particular, the thermosiphon system can be mounted on or integrated with a server rack sub-assembly for insertion into a server rack. The server rack sub-assembly can contain or support a number of heat-generating electronic devices, and the evaporator of the thermosiphon system can contact one or more of the electronic devices. In addition, the thermosiphon system can be mounted on a circuit card assembly, a daughter card, and/or other boards that carry heat-generating electronic devices.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107. The slots, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 4:
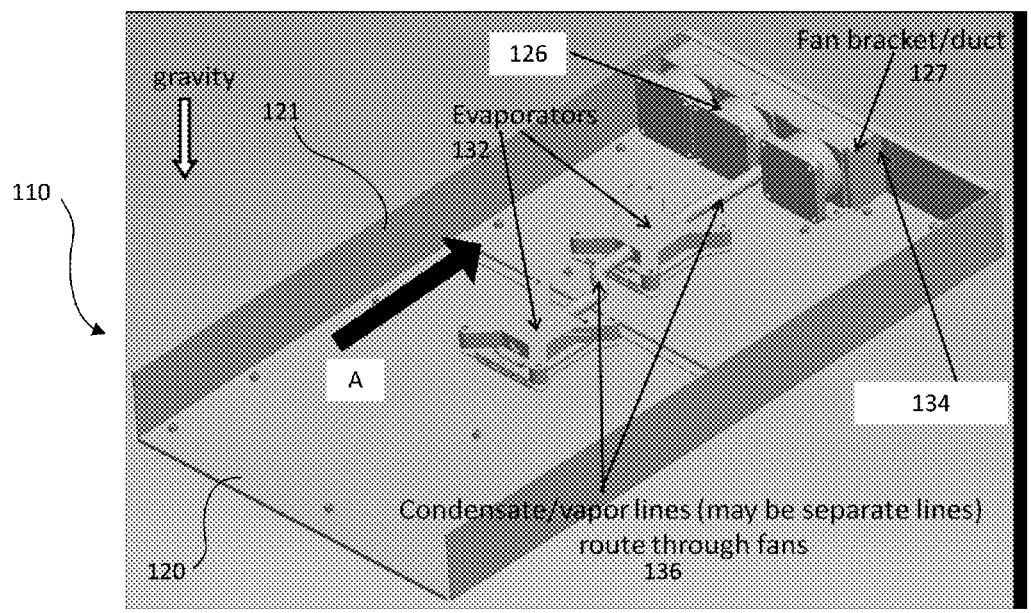
FIG. 4 illustrates a perspective view of a server rack sub-assembly (but omits the printed circuit board and heat generating elements to provide a view of more of the frame).
Figure 11:
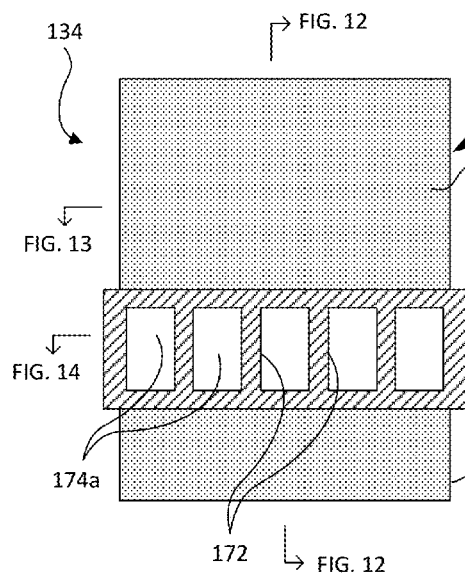
FIGS. 11 and 12 illustrate side views, cross-sectional, of a condenser from the thermosiphon system.
Figure 12:
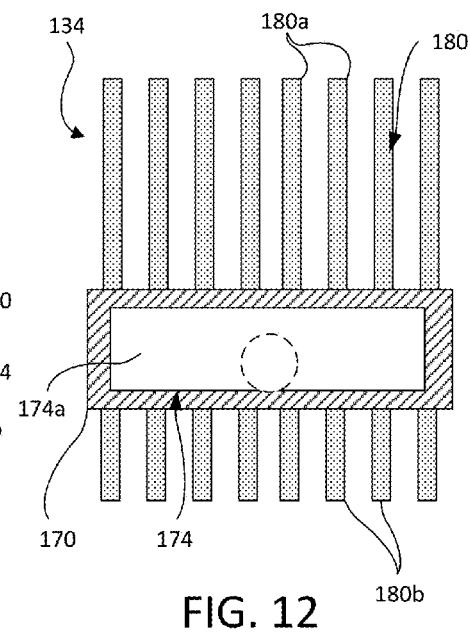
Figure 13:
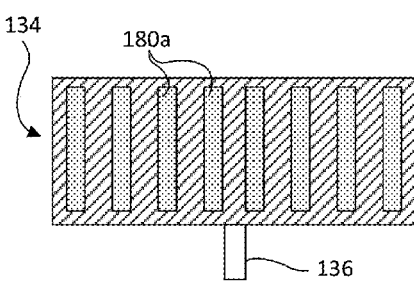
FIGS. 13 and 14 illustrate top views, cross-sectional, of the thermosiphon system of FIGS. 8 and 9.

Referring to FIGS. 2A, 3 and 4, the server rack sub-assembly 110 includes a frame or cage 120, a printed circuit board 122, e.g., a motherboard, supported on the frame 120, one or more heat-generating electronic devices 124, e.g., a processor or memory, mounted on the printed circuit board 122, and a thermosiphon system 130. One or more fans 126 can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIGS. 2 and 3 illustrate the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 2A illustrates the frame 120 as a flat plate, the frame 120 can include one or more side walls 121 (see FIG. 4) that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans 126 can be placed on the frame 120 so that air enters at the front edge (at the left hand side in FIG. 3) of the server rack sub-assembly 110, closer to the front of the rack 105 when the sub-assembly 110 is installed in the rack 105, flows (see arrow A in FIG. 4) over the motherboard and over some of the heat generating components on the motherboard 122, and is exhausted from the server rack assembly 110 at the back edge (at the right hand side in FIG. 3), closer to the back of the rack 105 when the sub-assembly 110 is installed in the rack 105. The one or more fans 126 can be secured to the frame 120 by brackets 127. Thus, the fans 126 can pull air from within the frame 120 area and push the air after it has been warmed out the rack 105. An underside of the motherboard 122 can be separated from the frame 120 by a gap.

The thermosiphon system 130 includes an evaporator 132, a condenser 134, and condensate/vapor lines 136 connecting the evaporator 132 to the condenser 134. As shown in FIG. 2B, each condensate/vapor line 136 can include two nested tubes, including an outer tube 136a and an inner tube 136b. The volume between the outer tube 136a and the inner tube 136b provides an outer passage 138a, and the volume inside the inner tube 136b provides an inner passage 138b. The inner tube 136b can be about 5-25% of the cross sectional area of the outer tube 136a, e.g., the inner tube can be about one-third the diameter of the outer tube 136a. The inner tube 136b can rest on the inner bottom surface of the outer tube 136a. The inner tube 136b can be bonded to the inner bottom surface of the outer tube 136a.

Referring to FIGS. 2A and 2B, the evaporator contacts the electronic device 124 so that heat is drawn by conductive heat transfer from the electronic device 124 to the evaporator 132. In particular, the bottom of the evaporator 132 contacts the top of the electronic device 124. In operation, heat from the electronic device 124 causes a working fluid in the evaporator 132 to evaporate. The vapor then passes through condensate/vapor lines 136, particularly through the outer passage 138a, to the condenser 134. Heat is radiated away from the condenser 134, e.g., into air blown or drawn by the one or more fans 126 that passes across the condenser 134, causing the working fluid to condense. The condensed working fluid can flow back through the condensate/vapor line 136, particularly through the inner passage 138b, to the evaporator 132.

As shown in FIG. 2A, the condenser 134 can be located on an opposite side of one or more of the one or more fans 126 from the evaporator 132. Alternatively or in addition, the condenser 134 can be located on a same side of one or more of the one or more fans 126 as the evaporator 132.

As shown in FIG. 2A, the condensate/vapor line 136 is at a slight (non-zero) angle so that gravity causes the condensed working fluid to flow back through the condensate/vapor lines 136 to the evaporator 132. Thus, in some implementations, at least a portion of the condensate/vapor lines 136 is not parallel to the main surface of the frame 120. For example, the condenser-side end of the condensate/vapor line 136 can be about 1-5 mm, e.g., 2 mm, above the evaporator-side end of the condensate/vapor line 136. However, it is also possible for the condensate/vapor line 136 to be horizontal tube, or even at a slightly negative angle (although the positive angle provides an advantage of gravity improving flow of the liquid from the condenser to the evaporator). Because there can be multiple heat generating electronic devices on a single motherboard, there can be multiple evaporators on the motherboard, where each evaporator corresponds to a single electronic device. As shown in FIG. 2A, there is a first evaporator 132 and a second evaporator 132 as well as a first electronic device 124 and a second electronic device 124. The condensate/vapor line 136 connecting the first evaporator to the second evaporator can be level, or can have a slight positive angle (with the evaporator 132 and end of the tube 136 that is farther from the condenser 130 being lower than the other evaporator).

During operation, the top surface of the liquid inside the condenser will be above the top surface liquid height in the evaporator, e.g., by 1 to 10 mm. It can be easier to achieve this with a condensate/vapor line 136 that is at a slight (positive non-zero) angle, but proper selection of the thermal and mechanical properties of the working fluid in view of the expected heat transport requirements for the thermosiphon system may still achieve this for a condensate/vapor line 136 that is horizontal or at a slightly negative angle.

During operation, the liquid phase of a working fluid can fill at least bottom portion of an interior volume of the inner passage 138b of the condensate/vapor line 136, with the bottom portion extending from the condenser to the evaporator, and a vapor phase of the working fluid can pass through the outer passage 138a of the condensate/vapor line 136. Some portion of the inner passage 138b can carry vapor, or some portion of the outer passage 138a can carry liquid. Due to the separation of the inner passage 138b from the outer passage 138a by the inner tube 136b, shear stress between the liquid and the vapor phases of the working fluid flowing in opposite directions can be reduced, thus improving condensate flow to the evaporator and improving efficiency. In fact, a system with the nested tubes can increase the heat transport capacity by a factor of ten, e.g., from 100 W to 1150 W. In some implementations, the inner passage 138b is completely filled by the liquid phase of the working fluid, as this provides better separation of the liquid and vapor and thus better reduction in shear stress.

In some implementations, the condenser 134 can be located at a height above the evaporator 132 such that a liquid phase of the working fluid fills a bottom portion of an interior volume of the condensate/vapor line 136, i.e., the inner passage 138b, and such that during operation a top surface of the liquid phase has at a non-zero angle relative to horizontal from the condenser 132 to the evaporator 134, and a vapor phase of the working fluid can pass through a top portion of the interior volume of the condensate/vapor line 136, i.e., the outer passage 138a, the top portion extending from the condenser 132 to the evaporator 134.

FIGS. 2A-4 illustrate a thermosiphon system 130 with multiple evaporators 132; each evaporator 132 can contact a different electronic device 124, or multiple evaporators 132 could contact the same electronic device, e.g., if the electronic device is particularly large or has multiple heat generating regions. As shown in FIGS. 2-4, the multiple evaporators 132 can be connected by the condensate/vapor lines 136 to the condenser 134 in series, i.e., a first condensate/vapor line connects the condenser to a first evaporator, and a second condensate/vapor line connects the first evaporator to a second evaporator. Alternatively, some or all of the multiple evaporators 132 can be connected by the condensate/vapor lines 136 to the condenser 134 in parallel, i.e., a first condensate/vapor line connects the condenser to a first evaporator, and a second condensate/vapor line connects the condenser 134 to a second evaporator. Advantages of a serial implementation is fewer tubes, whereas an advantage of parallel tubes is that the tube diameters can be smaller.

FIGS. 2A-4 illustrate a thermosiphon system 130 in which nested tubes are used for the condensate flow from the condenser 134 to the evaporator 132 and for vapor flow from the evaporator 132 to the condenser 134. Thus, in this implementation the fluidical coupling between the evaporator 132 and the condenser 134 consists of the combined condensate and vapor transfer line. A potential advantage of the combined condensate and vapor transfer line is that the line can be connected to a side of the condenser, reducing the vertical height of the system relative to a system with a separate line for the vapor, since the vapor line is typically coupled to or near the top of the evaporator. The condensate/vapor line 136 can be a tube or pipe, e.g., of copper or aluminum. Another potential advantage is that with nested tubes only the outer tube needs to be leak-tight. In comparison to separate tubes for the condensate and vapor, the nested tubes system needs fewer joints that are required to be leak-tight, thus improving lifetime of the device.

FIGS. 5 and 6A illustrate a thermosiphon system 130 in which the evaporator 132 that includes a housing that encloses a chamber 146 and a wick 142. The housing can include a base 140 and a case 144 that is secured to the base 140. The housing has an opening to connect the chamber 146 to both the outer passage 138a and the inner passage 138b of the condensate line 136, but the chamber 146 can otherwise be sealed and fluid-tight. The case 144 can be a transparent material to permit observation of the interior of the evaporator 132.

The base 140 is formed of a thermally conductive material, e.g., copper. The housing, e.g., the bottom of the base 140, can directly contact the electronic device 124, e.g., the top surface of the electronic device 124. Alternatively, the housing, e.g., the bottom of the base 140, can be connected to the electronic device 124, e.g., the top surface of the electronic device 124, by a thermally conductive interface material 141, e.g., a thermally conductive pad or layer, e.g., a thermally conductive grease or adhesive.

The wick 142 can be formed on the bottom interior surface of the housing, e.g., on the top surface of the base 140. The wick 142 is a thermally conductive area that transfers heat from the base 140 to the working fluid 160. In addition, the wick 142 can be configured to draw the working fluid 160 by capillary action. In some implementations, the wick 142 can be a porous or roughened region of the top surface of the base 140. For example, the wick 142 can be formed from copper particles that are bonded to the top surface of the base 140. For example, copper particles with a mean diameter of 25 microns can deposited to a depth of about 0.25 mm on the top surface of the base 140 and then sintered. Other possibilities for the wick 142 include a porous material that sits on the base 140, microgrooving on the base 140, or a screen wick. Apart from the roughness of the wick 142, the bottom interior surface of the housing can be a planar surface.

A portion of the vapor/condensate line 136 can project into the chamber 146. An aperture 139 is formed in the inner tube 136b in a region above the wick 142. Although FIGS. 5 and 6A illustrate a gap between two inner tubes 136b, there could be a single inner tube 136 with an opening in the lower surface of the inner tube 136b closer to the base 140.

In operation, a working fluid 160, in liquid form, flows from the inner passage 136b into the chamber 146. The working fluid 160 can flow through the opening 139 and onto the wick 142 (see FIG. 6A). The working fluid can fill a volume between the base 140 and the bottom of the inner tube 136b, thereby forming a thin layer 162 of working fluid on the wick 142. A remainder of the working fluid can flow down the inner tube 136 to another evaporator 132. By creating a thin layer 162 of the working fluid, the thermal resistance of the evaporator is effectively reduced (because the working fluid can evaporate more readily from a thin layer, permitting greater heat transfer).

Referring to FIG. 6B, another implementation is similar to the implementation described above for FIG. 6A, but a drainage port 139a extends downwardly from the inner tube 136a toward the base 140. In operation, the working fluid 160 flows out of the port 139a to fill a volume between the base 140 and the bottom of the port 139a, thereby forming a thin layer 162 of working fluid on the wick 142. The gap between the wick 142 and the bottom of the port 139a can be about 1 to 5 mm, e.g., 2 mm. The port 139a can have a diameter of about 1 to 5 mm, e.g., 2 mm. An advantage of the drainage port is that it can permit creation of a thinner layer of working fluid on the wick 162, thus improving heat transfer.

The drainage port 139a or the opening 139 can be located near the center of the wicking surface 142. Delivering the working fluid to the center of the wicking surface 142 improves the likelihood that the entire surface of the wicking surface 142 will remain wetted.

FIGS. 7-10 illustrate an evaporator 132 that includes a flow restrictor 150. The evaporator 132 can otherwise be constructed as described for the implementations above. The vapor/condensate lines 136 need not project into the chamber 146.

The flow restrictor 150 is configured to restrict flow of a working fluid from the condensate line 136 onto a portion of the wick 142. In operation, a working fluid 160, in liquid form, flows from the condensate line 136, specifically from the inner passage 138a, into the chamber 146 and pools before or around the flow restrictor 150 (see FIG. 9). The flow restrictor 150 permits a small portion of the working fluid to pass, creating a thin layer 162 of the working fluid 160 on an active area on the bottom interior surface of the housing, e.g., on top of the base 140. By creating a thin layer 162 of the working fluid, the thermal resistance of the evaporator is effectively reduced (because the working fluid can evaporate more readily from a thin layer, permitting greater heat transfer).

The flow restrictor 150 can be a barrier 150a of fluid-impermeable material on the bottom interior surface of the housing between the wick 142 and the opening to the condensate line 136. The barrier 150a partitions the bottom interior surface of the housing into a first portion 152 into which the liquid working fluid can flow easily, and a second portion 154 into which flow of the working fluid is restricted. That is, the working fluid must pass under or through the barrier in order to flow from the first portion 152 to the second portion 154. The first portion 152 can be adjacent the opening to the condensate line 136. The second portion 154 can be positioned directly over the electronic device 124. Thus, the active area of the bottom interior surface of the housing that receives the most heat from the electronic device 124 can be the region in which the thin layer 162 of the working fluid is created.

The barrier 150a can surround part or all of the wick 142, so that the second portion 154 can partially or entirely overlie the wick 142 (the barrier 150a can still be considered to "surround" a portion of the wick 142 when it rests on the wick 142). Optionally, some portion of the wick 142 can extend past the barrier 150a into the second portion 154. In the implementation illustrated in FIGS. 5-7, the barrier 150a and the first portion 152 entirely surround the second portion 154, such as the horizontal plane. However, in some implementations the second portion 154 could abut the housing, e.g., abut the case 144, so that a wall of the housing forms part of the perimeter of the second portion 154, with the barrier 150a providing a remainder of the perimeter.

The flow restrictor 150, e.g., the barrier 150a, can have a plurality of apertures 156 therethrough (see FIG. 10) to permit the liquid working fluid to flow into the second portion 154. The plurality of apertures 156 can be positioned adjacent the bottom interior surface of the housing, e.g., adjacent the top surface of the base 140. The apertures are sized based on the thermal properties of the working fluid and the expected heat transfer of the thermosiphon system such that a small portion of the working fluid passes through the barrier 150a, creating a layer 162 of the working fluid 160 on the active area. In addition or in the alternative, where a portion of the barrier 150a rests on the wick 142, working fluid could be pulled below the barrier 150a through the wick 142 itself.

The barrier 150a dams the working fluid 160 so that a portion of the working fluid pools on a side of the barrier 150a closer to the opening, e.g., over the first portion 152 of the bottom interior surface. In short, the flow restrictor is configured such that a depth of the working fluid is greater over a region of the housing between the barrier and the opening, e.g., over the first portion 152, than over the portion of the wick, e.g., than over the second portion 154.

The housing includes a top interior surface, e.g., provided by the case 144. There can be a gap between the barrier 150a and the top interior surface. The opening from the chamber 144 to the condensate line 136 can be located in an interior side surface of the housing. For example, the opening from the chamber 144 to the condensate line 136 can be positioned adjacent the bottom interior surface of the housing, e.g., adjacent the top surface of the base 140.

Although the housing composed of the base 142 and case 144 illustrated by FIGS. 5-10 is cylindrical, this is not required, and the housing could be another right solid, e.g., a rectangular solid, or some other shape. Similarly, where a flow restrictor is used, the first and second portions 152, 154 of the bottom interior surface can be rectangular, other simple polygons, e.g., convex polygons, or non-self-intersecting curved shapes, e.g., circles or ellipses, are possible, and the first and second portions need not be geometrically similar.

The condenser 132 includes a plurality of chambers, and a plurality of heat conducting fins. The chambers can be parallel and vertically-extending. The top ends of the chambers can be closed off, i.e., there is no top header that interconnects the top ends of the chambers.

FIGS. 11-15 illustrate a first implementation of the condenser 134 that has a body 170 having cavity 174 formed therein, and a plurality of walls 172 in the cavity that divide the cavity 174 into a plurality of parallel vertically-extending chambers 174a. The chambers 174a can be parallel and vertically-extending. The top ends of the chambers 174a can be closed off, i.e., there is no top header that interconnects the top ends of the chambers 174a. The walls 172 act as a condensation surface and to conduct heat from the vapor, through the body to the fins.

The cavity 174 also includes a central channel 176 with an opening to the exterior of the body 170 which is coupled to the condensate line 136. The vertically-extending chambers 174a can extend laterally from the central channel 176, and the chambers 174a can extend parallel to the long axis of the body 170 (i.e., the body has a length greater than its width, and the long axis is along the length). The central channel 176 can extend laterally perpendicular to the long axis. When the condenser 134 is installed on the frame, the central channel 176 can run from the front toward the rear of the body 170. A first set of the vertically-extending chambers 174 can extend laterally from a first side of the central channel 176, and a second set of the plurality of vertically-extending chambers 174 can extend laterally from an opposite second side of the central channel 176. The body 170 can be a generally rectangular solid, although other shapes are possible.

This implementation of the condenser 134 that has a plurality of heat conducting fins 180 that project outwardly from the body 170. For example, the fins 180 can project vertically from the body 170. The fins 170 can be generally flat, narrow sheets. The fins 180 can project in parallel to each other from the body 170, and can be spaced apart with a regular pitch along a direction normal to their flat primary surfaces. In some implementations, the fins 180 include at least a first plurality of fins 180a that project upwardly from the top surface of the body 170. In some implementations, the fins 180 also include a second plurality of fins 180b that project downwardly from the bottom surface of the body 170.

When the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis perpendicular to, or at a slight angle to, the long-axis of the chambers 174a and/or the body 170.

Returning to FIG. 2, the condenser 134 can rest on the frame 120, and the fins 180b that project downwardly from the bottom surface of the body 170 can project below the plane of the motherboard 122. This can improve the available surface area for the fins to improve radiating efficiency of the condenser 134. This can also assist in limiting the vertical height of the condenser 134 so that the thermosiphon system 130 is compatible with the limited height available in the server rack environment. For example, a total height from a bottom of the tray to a top of the heat conducting fins can be at most 6 inches, e.g., at most 4 inches.

Figure 14:
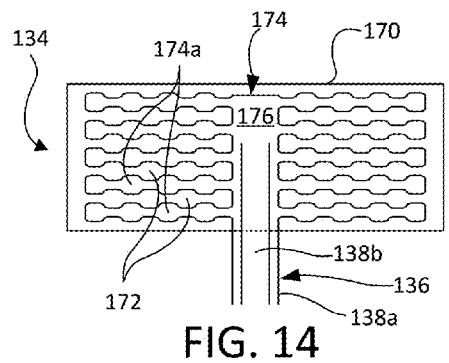
Figure 15:
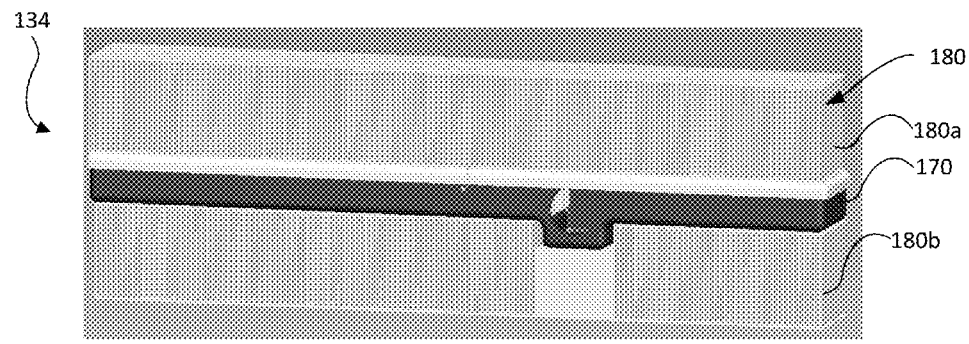
FIG. 15 illustrates a perspective view, cut away, of a condenser from the thermosiphon system.

As shown in the implementation of FIG. 5, the inner tube 136b of the condensate line 136 (but not the outer tube 136a) can project into the cavity 174 of the condenser 134 (see also FIG. 14). This configuration can improve efficiency of the thermosiphon system. As heat builds up, the velocity of the vapor phase of the working fluid will tend to increase, which can drive the liquid phase of the working fluid in the condenser toward the wall of the condenser further from the opening to the outer passage 138a. Placing the end of the inner tube 136b closer to the far wall can improve the likelihood that the entrance to the inner passage 136b remains covered by the liquid phase of the working fluid, and the increased force from the vapor phase can improve the flow rate of the liquid phase into the inner passage 136b.

Figure 16:
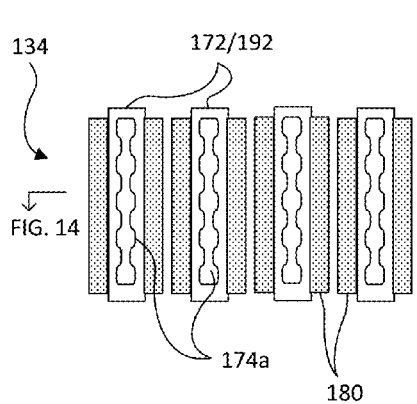
FIGS. 16 and 17 illustrate a top view and a side view, cross-sectional, of another implementation of a condenser.
Figure 17:
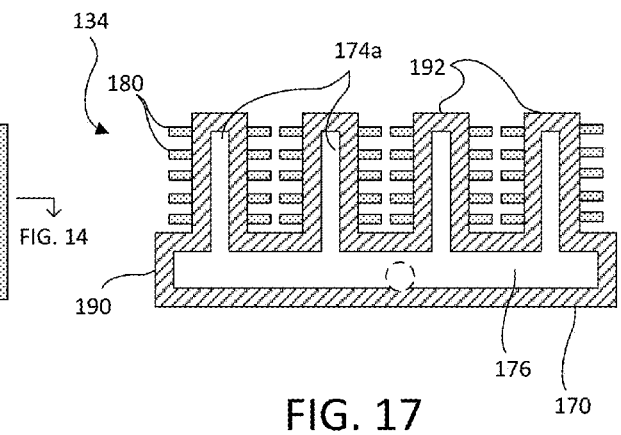
Figure 18:
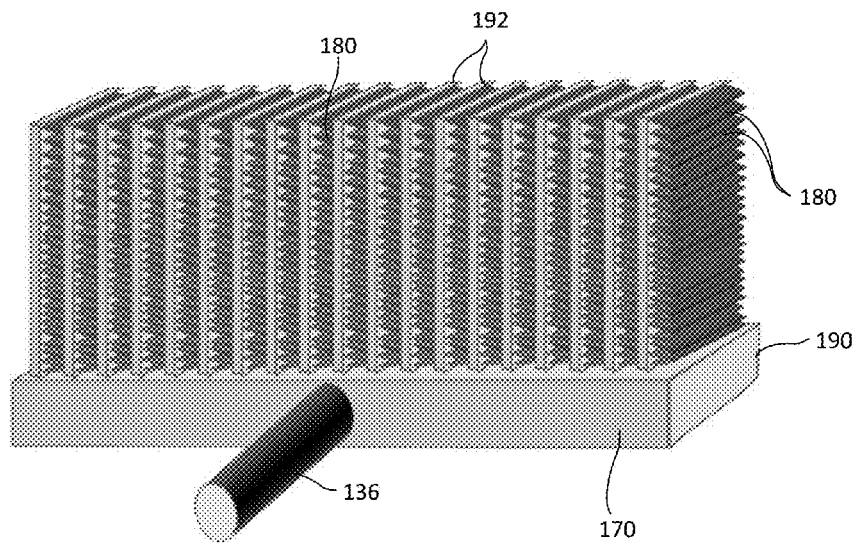
FIG. 18 illustrates a perspective view, cut away, of the other condenser.
Figure 19:
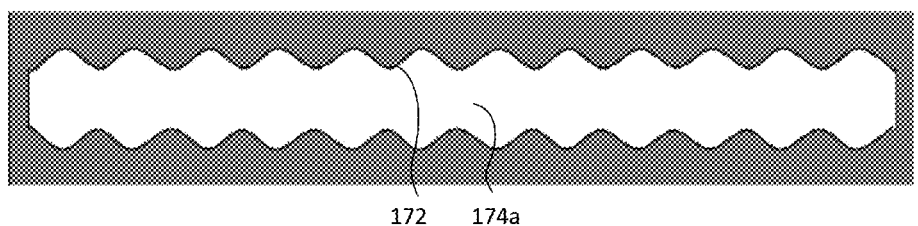
FIG. 19 is an expanded top view, cross-sectional, of a chamber in the condenser.

FIGS. 16-18, illustrate a second implementation of the condenser 134 that also has a plurality of heat conducting fins 180 that project outwardly from the body 170. However, in this implementation, the vertically-extending chambers 174a extend vertically from the central channel 176. In particular, the body can include a bottom header 190 which contains the central channel 176, and plurality of tubes 192 that project vertically from the bottom header 190 and contain the vertically-extending chambers 174a. The condensate line 136 is fluidically coupled to the bottom header 190 of the condenser 134.

Each chamber 174a can be formed by its own, and the walls 172 that form the boundaries of vertically extending chamber 174a can be walls of the tubes 192. The chambers 174a can extend perpendicular to the long axis of the body 170. Although the vertically extending chambers 174a are connected to a bottom header 190, the top ends of the chambers 174a can be closed off, i.e., the condenser 134 does not include a top header.

The fins 180 can project horizontally from the body 170, e.g., horizontally from the tubes 192. The fins 180 can extend parallel to the long axis of the bottom header 190. The fins 180 can be generally flat, narrow sheets. The fins 180 can project in parallel to each other from the body 170, and can be spaced apart, e.g., vertically spaced apart, with a regular pitch along a direction normal to their flat primary surfaces.

When the condenser 134 is installed on the frame, the fins 180 can be oriented with their length extending parallel or generally parallel to the direction of air flow generated by the fans, e.g., with their length running from the front toward the rear of the of the body 170. The fins 180 can be oriented with their long axis parallel to the long-axis of the chambers 174a.

In either implementation of the condenser, both the body 170 of the condenser 134 and the fins 180 can be formed of a material with a good terminal conductivity, comparable or better than aluminum, e.g., of at least 200 W/mK. A nickel plating can be used to solder the fins 180 to the body 170, or the fins 180 can be brazed to the body 170.

Figure 20:
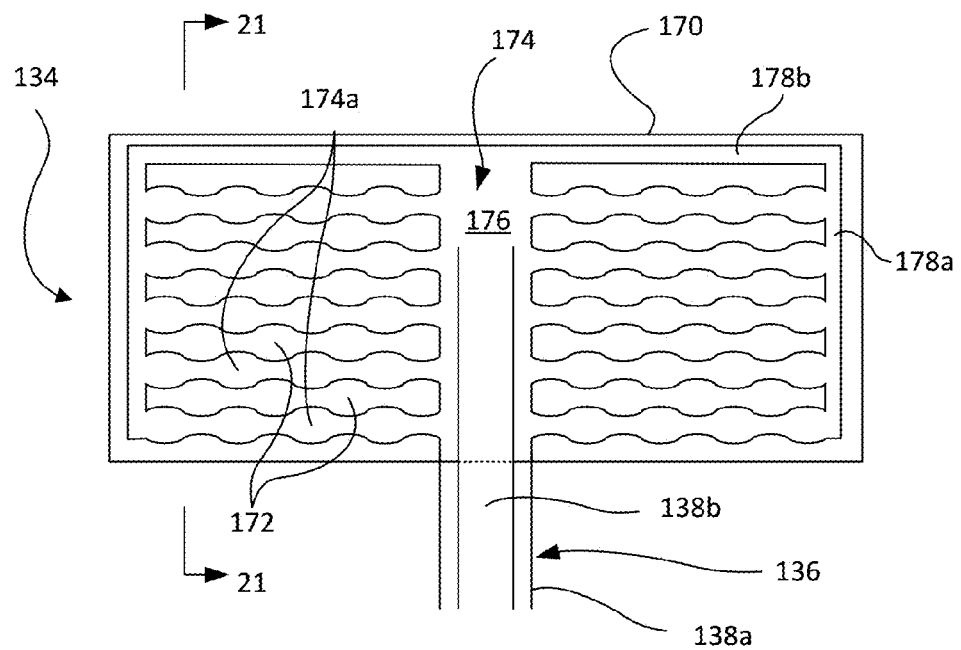
FIG. 20 illustrates a top view, cross-sectional, of another implementation of a condenser.
Figure 21:
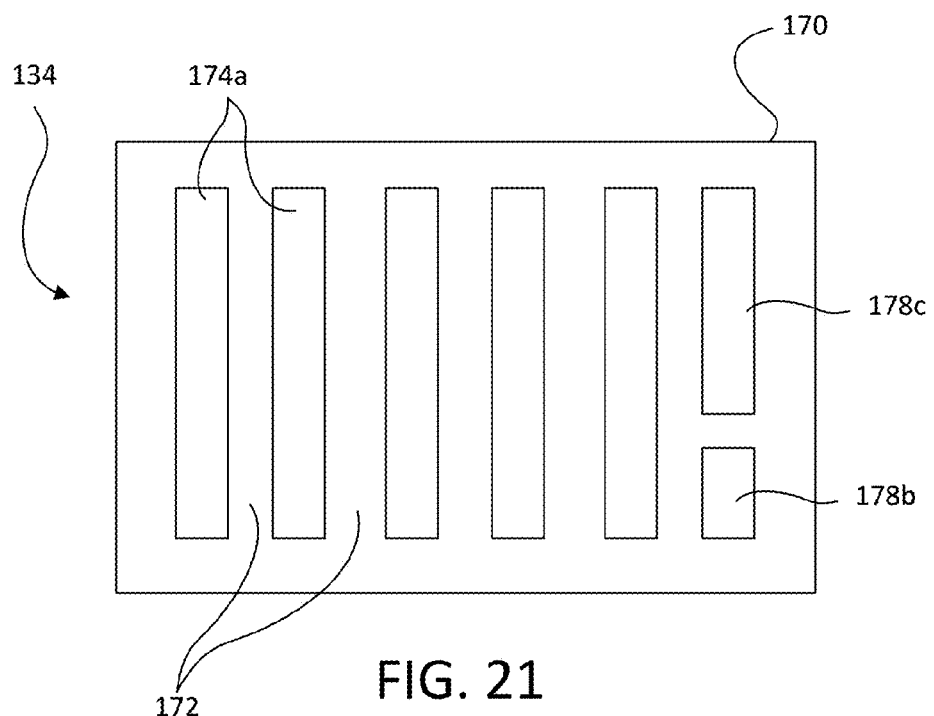
FIG. 21 illustrates a side view, cross-sectional, of the implementation of the condenser in FIG. 20.

Referring to FIGS. 20-21, in another implementation of the condenser, the ends of the chambers 174a further from the central channel 176 can be connected by a channel 178a. The channel 178a is fluidically connected by a channel 178b to an end of the central channel 176 further from the outer tube 138a. The channels 178a and 178b can be shorter than the chambers 174a, e.g., the channel 178a can be connected to the bottom of chambers 174a. Optionally, an additional laterally-extending chamber 178c can be positioned over the channel 178b to provide additional surface area for condensing. The condenser can otherwise be constructed similarly to the implementation shown in FIG. 11-15. A potential advantage of this configuration is that at high flow capacity, fluid that would otherwise build up at the end of the chamber 174a farther from the central channel 176 and be unable to flow back due to vapor flow, can instead flow through the channels 178a and 178b and thus return to the outgoing inner tube 138b.

Referring to FIGS. 14, 16, 20 and 19, at least some interior surfaces of the condenser, e.g., surfaces that bound the cavity 174, can optionally be texturized. The texturization can apply to either implementation of the condenser. The cavity 174 provides an interior volume bounded by a substantially vertical interior surface, e.g., a surface of one of the walls 172. The texturzation of the interior surface can include undulations projecting inwardly into the interior volume. The undulations can be uniform along a vertical first axis, and can project into the interior volume along a second axis perpendicular to the vertical first axis. Peaks of the undulations can be spaced apart, e.g., with a regular pitch, along a third axis perpendicular to the first axis and the second axis. The third axis can be parallel to the long axis of the body 170 and/or the chamber 174a. Each chamber 174a can have a length along the third axis and a width along the second axis with the length being greater than the width. The undulations can be smooth, e.g., no discontinuities in the surface along the second axis.

The undulations can have a pitch along the third axis between 0.1 and 1 mm and can have an amplitude along the second axis between 0.1 and 1 mm. In some implementations, a ratio of the pitch to the amplitude is between about 1:1 to 2:1. In some implementations, the undulations can form a sinusoidal wave. In some implementations, the undulations are formed by a plurality of curved segments in which dK/dS is equal to a constant value, where K is an inverse of the radius of curvature of the undulation and S is a distance along a curved segment. Other shapes for the undulations are possible. These undulations can cause thinning of the film of condensed working fluid that forms on the vertical interior surface, thereby reducing the thermal resistance of the condenser.

The working fluid can be a dielectric, non-flammable fluid with low toxicity, although but hydrocarbons such as methanol, ethanol or acetone can also be suitable. The composition of the working fluid and internal pressure of the thermosiphon system can be selected to provide a boiling point of the working fluid in the evaporator at about the desired operating temperature for the electronic devices, e.g., around 30-100° C., e.g., 45-55° C. Examples of the working fluid include Vextral XF sold by DuPont, Flourinet Electronic Liquid FC-72, sold by 3M, and Novec 7100, sold by 3M.

The entire interior of the thermosiphon system 130, including the interior of the evaporator 132, condenser 134 and vapor/condensate line 136, are vacuum filled and sealed. Initial vacuum can be pulled to achieve an internal absolute pressure below 0.05 millibar (5 Pa) to remove air from the thermosiphon system 130, and then the working fluid can be introduced into thermosiphon system 130.

Although a server rack sub-assembly has been described above, the thermosiphon system could be used with heat-generating electronic devices mounted on a motherboard that is not part of a server rack sub-assembly, e.g., on a motherboard in a desktop computer, or could be used with heat-generating electronic devices that are not mounted on a motherboard.

A number of embodiments of the invention have been described. Nevertheless, it will be understood that various modifications may be made without departing from the spirit and scope of the invention. Accordingly, other embodiments are within the scope of the following claims.

What is claimed is:

1. A thermosiphon system, comprising:
a condenser;
an evaporator comprising a housing and a chamber within the housing, the chamber having a planar bottom interior surface, at least one side wall extending from the bottom interior surface, and a wick located on the bottom interior surface in the housing; and
a condensate line fluidically coupling the condenser to the evaporator, the condensate line comprising an outer tube and an inner tube nested within the outer tube, a first passage defined by the inner tube positioned to carry a liquid phase of a working fluid from the condenser to the evaporator, and a second passage defined by a volume between the inner tube and the outer tube positioned to carry a vapor phase of the working fluid from the evaporator to the condenser, wherein the outer tube and inner tube extend parallel to the planar bottom interior surface, wherein the outer tube ends in an opening in the side wall, wherein the bottom interior surface of the evaporator is recessed relative to a bottom of the outer tube, and wherein the inner tube projects past the side wall and past the outer tube into the chamber in the evaporator and has an aperture positioned over the recessed bottom interior surface of the evaporator.

2. The thermosiphon system of claim 1, wherein the inner tube has a cross-sectional area about 5-25% of the outer tube.

3. The thermosiphon system of claim 1, wherein the inner tube contacts a bottom inner surface of the outer tube.

4. The thermosiphon system of claim 3, wherein the inner tube is bonded to the bottom inner surface of the outer tube.

5. The thermosiphon system of claim 1, wherein the outer tube is flush with the housing.

6. The thermosiphon system of claim 1, wherein the aperture is positioned over the wick.

7. The thermosiphon system of claim 6, wherein the aperture is positioned at a center of the wick.

8. The thermosiphon system of claim 6, wherein the aperture comprises a port projecting downwardly from the inner tube.

9. The thermosiphon system of claim 1, wherein the aperture comprises a gap between two portions of the inner tube.

10. The thermosiphon system of claim 1, wherein the condenser includes a central channel and the inner tube projects into the central channel.

11. The thermosiphon system of claim 10, wherein the outer tube is flush with an outer face of the central channel.

12. The thermosiphon system of claim 10, wherein the inner tube projects past the outer tube into the central channel.

13. The thermosiphon system of claim 10, wherein the condenser comprises a plurality of chambers extending laterally from the central channel.

14. The thermosiphon system of claim 1, wherein the evaporator includes a flow restrictor located in the housing to restrict flow of the working fluid onto the wick.

15. The thermosiphon system of claim 1, wherein the chamber comprises a ceiling spaced above a top of the outer tube.

16. The thermosiphon system of claim 1, comprising a second inner tube projecting into the chamber, the inner tube and the second inner tube substantially co-linear and spaced apart horizontally.

17. The thermosiphon system of claim 1, wherein the inner tube extends entirely through the chamber.

* * * * *